Dec. 23, 1969 F. T. THOMPSON 3,486,041

SEMICONDUCTOR TIME DELAY CIRCUITS

Filed Aug. 10, 1966 2 Sheets-Sheet 1

WITNESSES

Theodore F. Wrobel

James F. Young

INVENTOR

Francis T. Thompson

BY

Clement L. McHale

ATTORNEY

SEMICONDUCTOR TIME DELAY CIRCUITS

Filed Aug. 10, 1966 2 Sheets-Sheet 2

United States Patent Office 3,486,041

Patented Dec. 23, 1969

3,486,041

SEMICONDUCTOR TIME DELAY CIRCUITS

Francis T. Thompson, Verona, Pa., assignor to Westinghouse Electric Corporation, Pittsburgh, Pa., a corporation of Pennsylvania Filed Aug. 10, 1966, Ser. No. 571,613
Int. Cl. H03k 17/28
U.S. Cl. 307—252 8 Claims

ABSTRACT OF THE DISCLOSURE

This invention relates to time delay circuits and more particularly, to time delay circuits employing semiconductor means. A time delay circuit comprising a resistor and a capacitor connected across a source of potential to charge the capacitor and semiconductor means connected to said capacitor for producing an output when the potential across the capacitor increases to a predetermined portion of the potential of said source after a predetermined time interval. A means is connected to said capacitor to discharge said capacitor and to bypass said semiconductor means if the potential from said source should be momentarily interrupted prior to the end of said predetermined time interval to prevent said semiconductor means from producing a premature output.

In certain types of known time delay circuits, a unijunction transistor is employed in combination with a resistance-capacitance network to produce an output signal, which may be employed to actuate a switching operation to energize an external load, after a predetermined time interval or delay between the time that an earlier input signal is initiated and the time that the output signal is produced. The input signal which initiates the time delay period may be provided by applying power or potential to the time delay circuit. Since the firing voltage or potential of a unijunction transistor is substantially a fixed fraction or portion of the applied interbase voltage or potential, the firing voltage of the unijunction transistor varies with the interbase voltage. It has been found that if the power or potential applied to the time delay circuit of a conventional type is momentarily interrupted or removed for an instant after the time delay period is initiated and during the charging of the capacitor which forms part of the resistance-capacitance network included in the time delay circuit, the interbase potential applied to the unijunction transistor is immediately lowered. Since the firing or triggering voltage of the unijunction transistor is substantially a fixed fraction or portion of the interbase potential, the potential across the capacitor at the time the power potential is momentarily interrupted may be sufficient to fire or trigger the unijunction transistor and produce an output signal which may actuate a switching means to energize an external load circuit before the end of the desired time delay period for which the time delay circuit is designed. This is particularly a problem where the external load circuit may be energized from a separate source of power or potential.

It is therefore desirable to provide an improved semiconductor time delay circuit which overcomes the problem just described and which provides additional desirable features as well.

It is an object of this invention to provide a new and improved semiconductor time delay circuit.

Another object of this invention is to provide means for preventing a premature output in a semiconductor time delay circuit due to a momentary interruption in the potential applied to the time delay circuit.

A further object of this invention is to provide means in a semiconductor time delay circuit for reducing inrush currents in certain types of external load circuits, whose energization is controlled by the semiconductor time delay circuit.

Other objects of the invention will, in part, be obvious and will, in part, appear hereinafter.

For a fuller understanding of the nature and objects of the invention, reference should be had to the following detailed description, taken in conjunction with the accompanying drawings, in which.

Figure 1:
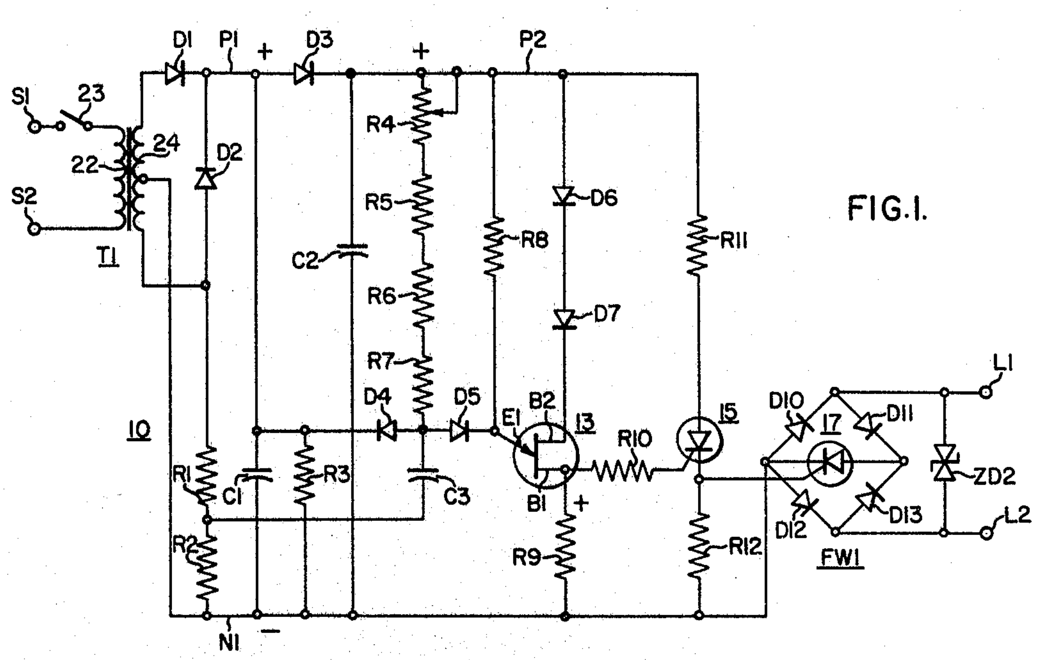
FIGURE 1 is a schematic diagram of a semiconductor time delay circuit embodying the principal features of the invention.

Referring now to the drawings and FIGURE 1 in particular, there is illustrated a semiconductor time delay circuit 10 embodying the teachings of the invention. In general, the time delay circuit 10 is connected between the input terminals S1 and S2 and the output terminals L1 and L2 to introduce a predetermined time delay between the time that a potential is applied to the primary winding 22 of the input transformer T1 and the time that a load connected to the output terminals L1 and L2 is energized by the actuation of a semiconductor switching means connected across the output terminals L1 and L2 to a conducting condition.

As illustrated, the input terminals S1 and S2 of the time delay circuit 10 are adapted to be connected to a source of alternating current power or potential. The primary winding 22 of the input transformer T1 may be connected across the input terminals S1 and S2 through the separable contacts of a suitable circuit interrupter, such as the switch 23, which may be provided to control the application of the alternating current potential at the input terminals S1 and S2 to the balance of the time delay circuit 10 and to initiate the time delay period provided by the operation of the time delay circuit 10. In order to rectify the alternating current potential or voltage applied at the input terminals S1 and S2, the diodes or rectifiers D1 and D2 are connected between the respective ends of the secondary winding 24 of the transformer T1 and a common direct-current output terminal at the positive conductor T1 in a full wave arrangement, as shown in FIGURE 1, while the mid-tap of the secondary winding 24 is connected to the other direct-current output terminal at the negative conductor N1. The positive conductor P1 is connected to the positive conductor P2 through the diode D3 which is connected in a forward direction with respect to the positive conductor P1 for reasons which will be explained hereinafter. In order to assist in filtering the direct-current output between the positive conductor P2 and the negative conductor N1, and for another purpose which will be described hereinafter, the capacitor C2 is connected between the positive conductor P2 and the negative conductor N1. It is to be noted that the input transformer T1 also serves to isolate the alternating current potential at the input terminals S1 and S2 from the balance of the time delay circuit 10 including the output terminals L1 and L2 which may be connected to a different source of alternating current potential.

In order to provide a control potential or voltage for the firing of a unijunction transistor 13 which forms part of the time delay circuit 10, a resistance-capacitance network is provided which includes the rheostat R4, the resistors R5 through R7 and the capacitor C3 which are all connected in series circuit relationship between the positive conductor P2 at the upper end of the rheostat R4 and the junction between the resistors R1 and R2 with the lower end of the resistor R2 being connected to the negative conductor N1. The values of the rheostat R4 and the resistors R5 through R7 determine the rate at which the capacitor C3 is charged from the direct-current potential at the conductors P2 and N1 to a gradually increasing potential when the switch 23 is closed. The resistor R2 is connected in series with the resistor R1 to form a voltage dividing network which is connected between one end of the secondary winding 24 of the transformer T1 and the negative conductor N1 to add an alternating current potential in series with the potential across the timing capacitor C3. The resultant or sum of the potentials across the capacitor C3 and the resistor R2 provide a control potential to which the unijunction transistor 13 responds.

As illustrated, the upper end of the timing capacitor C3 at the junction between the resistor R7 and the capacitor C3 is connected to the emitter E1 through the diode D5 which is normally blocked or substantially non-conducting until the instantaneous control potential between the upper end of the capacitor C3 and the lower end of the resistor R2 at the negative conductor N1 is sufficient to fire the unijunction transistor 13. The resistor R8 is also connected between the emitter E1 of the transistor 13 and the positive conductor P2 in order to provide a biasing current to the emitter E1 which is slightly less than the emitter current that is indicated at 302 in FIGURE 3 which corresponds to the peak point voltage, as indicated at 301 in FIGURE 3, and to thus establish an operating potential between the emitter E1 and the base B1 which is slightly less than that necessary to fire the unijunction transistor 13. The resistor R8 also serves to establish a potential at the emitter E1 which serves to block the diode D5 and to prevent the leakage of the charge on the capacitor C3 through the unijunction transistor 13 which would otherwise adversely affect the accuracy of the time delay provided by the time delay circuit 10. The upper base B2 is connected to the positive conductor P2 through the forward connected diodes D6 and D7 which may be provided to temperature compensate the operation of the unijunction transistor 13, while the lower base B1 of the transistor 13 is connected to the negative conductor N1 through the resistor R9.

In order to actuate or gate a first silicon controlled rectifier or thyristor 15 to a conducting condition or state when the unijunction transistor 13 is fired or triggered in response to the control potential just described, the gate of the thyristor 15 is connected to the base B1 of the unijunction transistor at the junction between the base B1 and the resistor R9 through the resistor R10. The anode of the thyristor 15 is connected to the positive conductor P2 through the resistor R11, while the cathode of the thyristor 15 is connected to the negative conductor through the resistor R12. When the thyristor 15 is turned "on" or rendered substantially conducting in response to the firing or triggering of the unijunction transistor 13, the current which flows in the anode-cathode circuit of the thyristor 15 through the resistor R11 serves as a holding current to maintain the thyristor 15 in a substantially conducting state as long as the potential at the input terminals S1 and S2 is maintained and the switch 23 remains closed.

In order to actuate an alternating current switching means provided at the output of the time delay circuit 10 to a conducting state or condition in response to the firing of the unijunction transistor 13 and the actuating of the thyristor 15 to a conducting condition, the switching means which comprises the full-wave rectifier bridge circuit FW1 and the silicon controlled rectifier or thyristor 17 is connected between the output terminals L1 and L2 of the time delay circuit 10 and the resistor R12. In particular, the gate of the thyristor 17 is connected to the cathode of the thyristor 15 at the junction between the cathode of the thyristor 15 and the resistor R12, while the cathode of the thyristor 17 is connected to the lower end of the resistor R12 at the negative conductor N1. The full-wave bridge circuit FW1 comprises the diodes D10 through D13 with the alternating current terminals of the bridge circuit being connected to the output terminals L1 and L2 of the time delay circuit 10 and with the unidirectional or direct-current terminals of the bridge circuit FW1 being connected, respectively, to the anode and to the cathode of the thyristor 17. When the thyristor 15 is actuated to a conducting state by the firing of the unijunction transistor 13, a gating current is applied to the gate of the thyristor 17 which is sufficient to actuate the thyristor 17 to a conducting state or condition to thereby establish a conducting path which extends between the output terminals L1 and L2 for alternating currents of either direction between the terminals L1 and L2 through the bridge circuit FW1 and the thyristor 17.

In order to protect the time delay circuit 10 from surge or peak voltages which might otherwise be applied to the time delay circuit 10 from whatever circuit is connected to the output terminals L1 and L2, a suitable bidirectional semiconductor breakdown device such as a thyrector ZD2 is connected across the output terminals L1 and L2 to limit the potential across the terminals L1 and L2 of either polarity to substantially a predetermined value. Instead of connecting a bidirectional semiconductor breakdown device, such as the thyrector ZD2, across the output terminals L1 and L2, a pair of separate, oppositely poled Zener diodes may be provided to ensure protection against surge or peak voltages by limiting such voltages of either polarity to a predetermined value. It is obvious to those skilled in the art that the diode bridge FW1 and thyristor 17 can be replaced by a bidirectional alternating current semiconductor switch, such as a TRIAC.

In order to provide an alternate discharge path for the timing capacitor C3 if the potential applied at the input terminals S1 and S2 of the time delay circuit should be momentarily interrupted during the time delay period when the capacitor C3 is charging to avoid a premature firing of the unijunction transistor 13, the diode D4 is connected between the junction of the capacitor C3 and the resistor R7 and the upper end of a resistor R3 whose lower end is connected to the negative conductor N1. The diode D4 is normally blocked by the potential across a capacitor C1 which is connected in parallel with the resistor R3 between the positive conductor P1 and the negative conductor N1. It is to be noted that the capacitor C1 is normally charged to the potential between the positive conductor P1 and the negative conductor N1 whenever a potential is applied to the input terminals S1 and S2 and the switch 23 is closed.

In the overall operation of the time delay circuit 10, the alternating current semiconductor switching means connected between the output terminals L1 and L2 is substantially non-conducting until an alternating current potential is applied at the input of the time delay circuit by suitable means, such as the closing of the switch 23. The alternating current switching means which includes the bridge circuit FW1 and the thyristor 17 will be actuated to a conducting condition or state after a predetermined time delay period between the application of the alternating current potential at the input of the time delay circuit 10 and the actuating of the alternating current switching means to a conducting condition.

More specifically, assuming that an alternating current potential is present at the input terminals S1 and S2 of the time delay circuit 10, the time delay period is initiated by the closing of a suitable means, such as the switch 23, which applies the potential to the input of the time delay circuit at the primary winding 22 of the transformer T1.

Figures 3, 5:
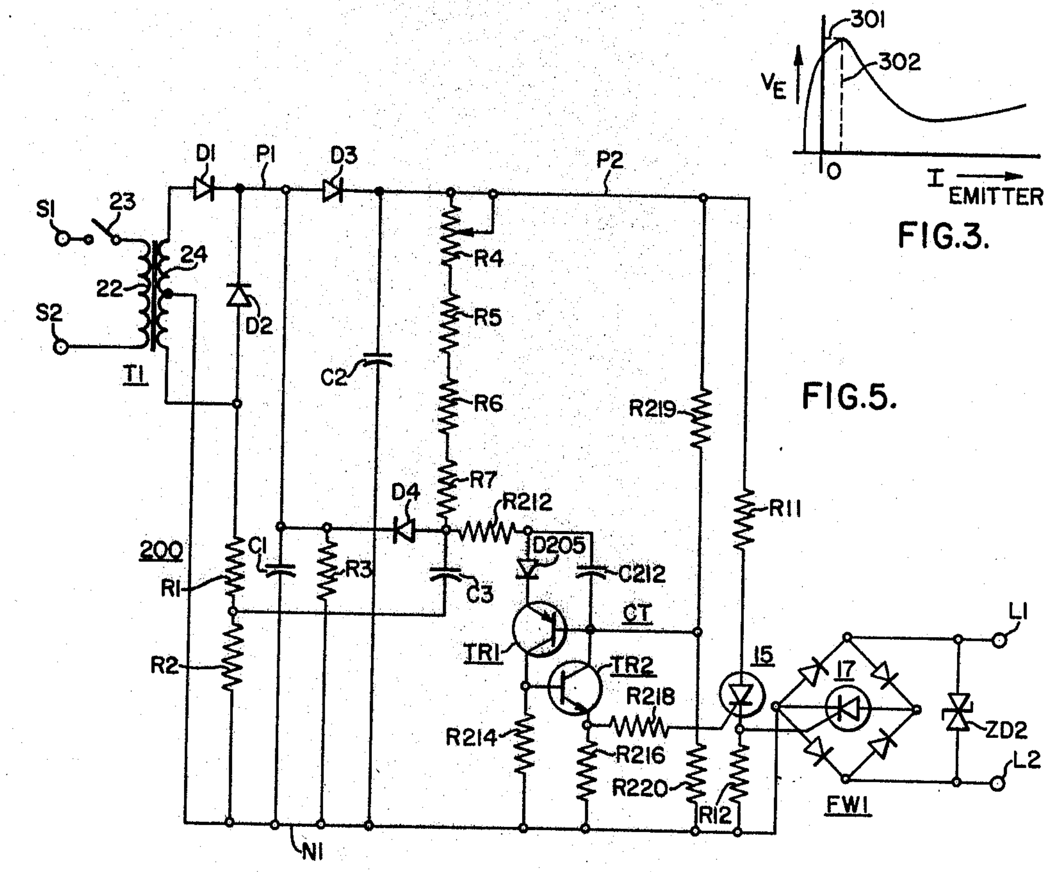
FIG. 3 is a graphical representation of some of the typical operating characteristics of a unijunction transistor.
FIG. 5 is a schematic diagram of another modified time delay circuit in accordance with this invention.

A rectified alternating current or direct-current output will appear between the positive conductor P1 and the negative conductor N1 and between the positive conductor P2 and the negative conductor N1. The capacitor C1 will immediately charge to substantially the maximum value of the unidirectional potential between the conductor P1 and the conductor N1. Similarly, the capacitor C2 will immediately charge to substantially the maximum or peak value of the unidirectional current potential between the conductor P2 and the conductor N1. When a potential is present between the conductors P2 and N1, the timing capacitor C3 will gradually charge to an increasing potential through the rheostat R4 and the resistors R5 through R7 at a rate which depends upon the values of said rheostat and said resistors and the value of the capacitor C3. The potential across the capacitor C3 will be positive at the end of the capacitor which is connected to the resistor R7 relative to the potential at the lower end of the capacitor which is connected to the junction between the resistors R1 and R2. The potential between the conductors P2 and N1 will result in a biasing current applied to the emitter E1 of the unijunction transistor 13 which will bias the operating point of the transistor 13 to be just below the peak point voltage of the transistor 13, as indicated graphically at 301 in FIGURE 3, which is a graphical representation of the typical operating characteristic of a unijunction transistor. The vertical axis in the graphical representation shown in FIGURE 3 is the emitter voltage with respect to the base B1 while the horizontal axis represents the emitter current flow between the emitter E1 and the base B1. The thyristor 15 remains in a substantially nonconducting condition until the firing or triggering of the transistor 13, while the alternating current switching means connected between the output terminals L1 and L2 will also remain in a substantially non-conducting condition until the firing or triggering of the transistor 13. When an alternating current potential is applied to the primary winding 22 of the input transformer T1, a relatively small alternating current potential will appear across the resistor R2 which is connected in series with the resistor R1 between the mid-tap of the secondary winding 24 of the transformer T1 and the lower end of the secondary winding 24 to provide an alternating current potential which is superimposed on the potential which results across the capacitor C3 due to the charging of the capacitor C3 from the conductors P2 and N1. The potential between the base B1 and base B2 will be substantially equal to the potential between the conductors P2 and N1 less the voltage drops across the diodes D6 and D7 and the resistor R9.

As shown in FIGURE 3, when the potential between the emitter E1 and the base B1 of the transistor 13 exceeds the peak point voltage, as indicated at 301 in FIGURE 3, the resistance between the emitter E1 and the base B1 will decrease to a relatively low value to permit the discharge of the capacitor C3. As mentioned previously, the control potential applied to the unijunction transistor through the diode D5 is equal to the resultant or sum of the instantaneous potentials across the capacitor C3 and the resistor R2. As the potential across the capacitor C3 approaches the value necessary to unblock the diode D5 and fire the transistor 13, the alternating current potential across the resistor R2 during the positive half cycles will cause the energy stored in the capacitor C3 to discharge in pulses as the firing potential of the transistor 13 is periodically exceeded. The discharge path of the capacitor C3 during the firing of the transistor 13 will extend from the upper end of the capacitor C3 through the diode D5, the emitter E1 of the transistor 13, the base B1 of the transistor 13, the resistor R9, and the resistor R2 to the lower end of the capacitor C3. An additional discharge path of the capacitor C3 will extend from the base B1 of the transistor 13 through the resistor R10, the gate-cathode path of the thyristor 15, the resistor R12, and through the resistor R2 to the lower end of the capacitor C3. It is important to note that the alternating current potential provided in series with the potential across the capacitor C3 along with the isolating diode D5 prevents any erratic or uncertain operation of the time delay circuit 10 by periodically increasing the potential between the emitter E1 and the base B1 and only permitting the capacitor C3 to discharge in periodic pulses which prevents the leakage of the charge from the capacitor C3 as the potential across the capacitor C3 approaches the potential necessary to fire the unijunction transistor 13. It is to be noted that the potential at the left end of the diode D5 with respect to the negative conductor N1 which depends on the instantaneous potentials across the capacitor C3 and the resistor R2 must be positive with respect to the voltage or potential at the cathode of the diode D5 in order to fire or trigger the unijunction transistor 13.

When the unijunction transistor 13 is fired or triggered in the manner just described, the current which results due to the discharge of the capacitor C3 in the gate-cathode circuit of the thyristor 15 is sufficient to actuate the thyristor 15 to a substantially conducting condition which results in a substantial increase in the current flow from the positive conductor P2 through the resistor R11, the anode-cathode path of the thyristor 15 and the resistor R12 to the negative conductor N1. It is to be noted that prior to the firing of the transistor 13 and the discharge of the capacitor S3, the resistor R9 and the resistor R10 provide a relatively low impedance path between the gate and the cathode of thyristor 15 to maintain the thyristor 15 in a blocked or substantially non-conducting condition until the capacitor C3 discharges in the manner just described.

When the thyristor 15 is actuated to a conducting condition as just described, the current which results in the anode-cathode path of the thyristor 15 produces a change in the voltage drop across the resistor R12 which is sufficient to actuate the thyristor 17 to a conducting state or condition. In particular, the thyristor 17 is turned "on" by a gate current which flows from the positive conductor P2 through the resistor R11, the anode-cathode path of thyristor 15, and the gate-cathode path of the thyristor 17 to the negative conductor N1. The alternating current semiconductor switching means which comprises the thyristor 17 and the bridge circuit FW1 is thus turned "on" to effectively form a conducting path or closed circuit which extends between the output terminals L1 and L2 to permit energization of whatever load is connected across the output terminals L1 and L2 from an external source of alternating current potential. It is to be noted that the current which results in the anode-cathode path of the thyristor 15 due to the firing of the transistor 13 exceeds the holding current of the thyristor 15 to thereby maintain the thyristor 15 in a conducting condition as long as the alternating current potential is applied at the input of the time delay circuit 10 and that the alternating current switching means across the output terminals L1 and L2 is also maintained in a conducting condition by the change in the voltage drop across the resistor R12 due to the conduction of the thyristor 15.

In the normal operation of the time delay circuit 10, during the time delay period when the capacitor C3 is charging as just described, the diode D4 is blocked since the potential across the capacitor C1 and the resistor R3 which is positive at the cathode of the diode D4 is sufficient to maintain the diode D4 in a blocked or substantially non-conducting condition during the charging of the capacitor C3. If, however, the alternating current potential at the input of the time delay circuit 10 should be momentarily interrupted or lost for an instant during the charging of the capacitor C3 prior to the firing of the transistor 13, the potential across the capacitor C3 might be sufficient to fire the unijunction transistor 13 if the interbase potential were permitted to decrease to a value such that the potential to which the capacitor C3 had charged before the momentary interruption would exceed the predetermined portion of the interbase potential necessary to fire the transistor 13. The unijunction transistor 13 might thus be fired and the output of the time delay circuit 10 actuated to a conducting condition prematurely before the desired time delay period had been completed. In order to prevent such a premature operation, the alternate discharge path previously described which includes the diode D4 and the resistor R3 is provided. If the alternating current potential at the input of the time delay circuit 10 is momentarily interrupted during the charging of the capacitor C3, the capacitor C1 which is normally charged to substantially the maximum potential between the conductors P1 and N1 which is a relatively much smaller capacitor than the filter capacitor C2 would discharge relatively quickly through the resistor R3 until the potential at the cathode of the diode D4 is relatively negative with respect to the potential at the upper end of the capacitor C3 to permit the capacitor C3 to discharge quickly through the resistor R3 and the resistor R2 to the lower end of the capacitor C3. The potential between the bases B1 and B2 of the unijunction transistor 13 would be maintained at a value above the interbase potential which would permit the capacitor C3 to discharge through the unijunction transistor 13 until the alternate discharge path just described became effective. In other words, if the alternating current potential at the input of the time delay circuit 10 were momentarily interrupted during the charging of capacitor C3, the capacitor C2 which is a much larger capacitor than the capacitor C1 would tend to maintain the potential between the bases B1 and B2 of the transistor 13 for a period of time longer than that necessary to permit the alternate discharge path for the capacitor C3 through the resistor R3 to become effective. The diode D3 prevents the capacitor C2 from discharging through the relatively smaller resistance of the resistor R3 during such a momentary interruption of the input potential to the time delay circuit 10. The charge on the capacitor C3 is thus discharged through a path which does not include or bypasses the unijunction transistor 13 to prevent a premature firing of the transistor 13 before the end of the desired time delay which is normally provided by the time delay circuit 10. The potential between the bases of the transistor 13 must be maintained sufficiently high for a period long enough to permit the capacitor C3 to discharge through the alternate discharge path just described during such a momentary interruption of the alternating current input potential during the normal charging of the capacitor C3.

Figure 2:
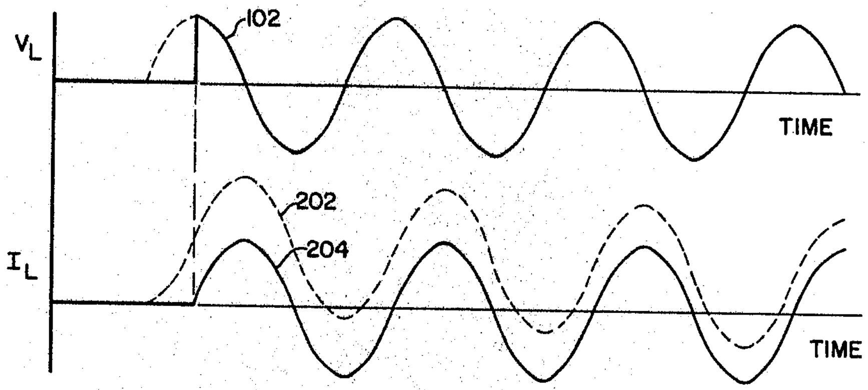
FIG. 2 is a set of waveforms illustrating the operation of the time delay circuit shown in FIG. 1.

It is important to note that in the operation of the time delay circuit 10, by superimposing an alternating current potential on the control potential which is applied to the unijunction transistor 13, the firing of the transistor 13 occurs only at the positive peaks of potential applied at the input of the time delay circuit 10 so that if the same alternating current potential is applied to the external load connected to the output terminals L1 and L2, the external load will be connected only at the positive peaks of the potential which is provided to energize the load connected to the terminals L1 and L2. In other words, if the alternating current potential applied at the input of the time delay circuit 10 is in phase with the alternating current potential which is provided to energize whatever load is connected to the output terminals L1 and L2 of the time delay circuit as shown in the upper waveform of FIGURE 2, the external load will only be energized at the positive peaks of voltage of the alternating current potential which is provided to energize the load connected to the terminals L1 and L2, as indicated by the waveform 102, to thus minimize current inrushes, as indicated by the load current waveform 204 in FIGURE 2. If an inductive load is connected to the output terminals L1 and L2 and the voltage is not applied to the inductive load at the peak of the energizing potential, the load current as indicated by the waveform 202 in FIGURE 2 would include a transient component which is gradually decreasing. In addition, by utilizing a portion of the alternating current input potential for the time delay circuit in the manner just described, the need for a separate source of potential pulses either to periodically raise the potential between the emitter and the base B1 or to periodically lower the interbase potential of the unijunction transistor in order to sample the potential across the timing capacitor C3 is eliminated.

Figure 4:
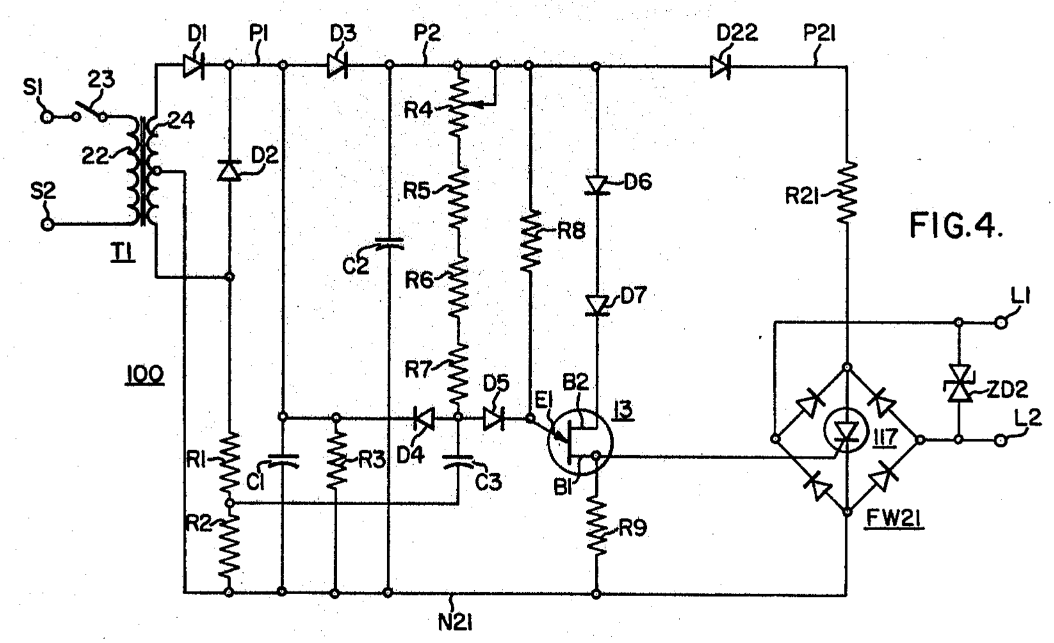
FIG. 4 is a schematic diagram of a modified time delay circuit in accordance with this invention.

Referring now to FIGURE 4 of the drawings, there is illustrated a modified embodiment of the invention in a time delay circuit 100 which, in general, is similar to the time delay circuit 10 previously described except that the first or pilot thyristor 15 which is connected intermediate the unijunction transistor 13 and the alternating current switching means at the output of the time delay circuit 10 is eliminated in the time delay circuit 100 with the unijunction transistor 13 being directly connected to the input of the alternating current switching means which in the time delay circuit 100 includes a thyristor 117 and a full-wave bridge circuit FW21 as shown in FIGURE 4.

More specifically, the portion of the time delay circuit 100 from the input terminals S1 and S2 up to the output of the unijunction transistor 13 is the same as previously described in detail in connection with the time delay circuit 10. It is to be noted, however, that the gate of the thyristor 117 is connected directly to the junction between the base B1 and the resistor R9 with the cathode of the thyristor 117 being connected directly to the negative conductor N21 as shown in FIGURE 4. The anode of the thyristor 117 is connected to the positive direct-current terminal of the full-wave bridge circuit FW21 and to the positive conductor P2 through the resistor R21, the positive conductor P21 and the diode D22, which is connected in a forward direction with respect to the potential at the positive conductor P2. The alternating current terminals of the bridge circuit FW21 are connected to the output terminals L1 and L2 of the time delay circuit 100 similarly to the time delay circuit 10 previously described.

In the operation of the time delay circuit 100, when the unijunction transistor 13 is fired or triggered in response to the control potential which is the sum or resultant of the instantaneous potentials across the timing capacitor C3 and the resistor R2, as previously described in connection with the time delay circuit 10, the capacitor C3 discharges from the upper plate of the capacitor C3 through the diode D5, the emitter E1 of the transistor 13, the base B1, the resistor R9 and the resistor R2 to the lower plate of the capacitor C3. In addition, the discharge current of the capacitor C3 flows from the base B1 through the gate-cathode circuit of the thyristor 117 and the resistor R2 to the lower plate of the capacitor C3 to gate or actuate the thyristor 117 to a conducting condition and to actuate the alternating current switching means which includes the thyristor 117 and the bridge circuit FW21 to a conducting condition. When thyristor 117 is actuated to a conducting condition, the value of current which flows from the positive conductor P2 through the diode D22, the resistor R21, and through the anode-cathode path of the thyristor 117 to the negative conductor N21 is greater than the holding current of the thyristor 117 to thus maintain the thyristor 117 in a conducting condition as long as the alternating current potential is applied at the input of the time delay circuit 100 and the switch 23 remains closed. The time delay circuit 100 possesses all of the advantages of the time delay circuit 10 as previously described and has the additional advantage that the need for a pilot thyristor is eliminated with the time delay circuit 100 supplying the actuating current directly to the thyristor 117 of the alternating current switching means at the output of the time delay circuit 100. It is to be noted that the additional diode D22 is provided to prevent the alternating current potential which is provided to energize whatever load is connected to the output terminals L1 and L2 of the time delay circuit 100 from also charging or affecting the potential across the capacitor C2 and thus altering the predetermined time delay which is provided by the operation of the time delay circuit 100.

Referring now to FIGURE 5 of the drawings, there is illustrated another modified embodiment of the invention in a time delay circuit 200 which in general is similar to the time delay circuit 10 previously described except that a complementary transistor circuit CT is employed instead of the unijunction transistor 13 as in the time delay circuit 10. As will be described in detail hereinafter, the operating characteristics of the transistor circuit CT are arranged to be similar to those of the unijunction transistor 13 previously described.

More specifically, the portion of the time delay circuit 200 from the input terminals S1 and S2 up to and including the resistance-capacitance network which includes the rheostat R4 and the resistors R5 through R7, as well as the capacitor C3, is the same as previously described in detail in connection with time delay circuit 10. The complementary transistor circuit CT includes a PNP transistor TR1 and an NPN transistor TR2, as well as a pair of series connected resistors R219 and R220 whose values have substantially the same ratio as the ratio between the potential between the emitter and the base B1 and the interbase potential of a typical unijunction transistor necessary to fire the unijunction transistor.

In particular, the emitter of the transistor TR1 is connected to the junction between the capacitor C3 and the resistor R7 through the resistor R212 and the isolating diode D205. The collector of the transistor TR1 is connected to the negative conductor N1 through the resistor R214. The base of the transistor TR1 is connected to the junction between the resistors R219 and R220 which, in turn, are connected in series between the positive conductor P2 and the negative conductor N1. For a purpose which will be described hereinafter, the capacitor C12 is connected between the junction of the resistor R212 and the diode D205 and the base of the transistor TR1. The collector of the transistor TR2 is connected to the base of the transistor TR1 while the emitter of the transistor TR2 is connected to the negative conductor N1. The base of the transistor TR2 is connected to the collector of the transistor TR1. The emitter of the transistor TR2 is also connected to the gate of the thyristor 15 through the resistor R218 with the balance of the time delay circuit 200 being the same as previously described in detail in connection with the time delay circuit 10.

In the operation of the time delay circuit 200, it is to be noted that the transistors TR1 and TR2 of the complementary transistor circuit CT are both normally maintained in a substantially non-conducting condition during the predetermined time delay period provided by the time delay circuit 200, while the capacitor C3 is charging to a potential which is sufficient when added to the alternating current potential across the resistor R2 to actuate the transistors TR1 and TR2 to conducting conditions. This is because the potential established by the voltage dividing network which includes the resistors R219 and R220 is arranged to block the isolating diode D205 which is connected between the emitter of the transistor TR1 and the junction between the timing capacitor C3 and the resistor R7. Similarly to the time delay circuit 10, the time delay period is initiated by applying the alternating current potential at the input of the time delay circuit 200 to the primary winding 22 of the input transformer TR1. When the charge on the capacitor C3 has increased, along with the corresponding potential across the capacitor C3, and the control potential applied to the input of the complementary transistor circuit CT which includes the resultant of the potentials across the capacitor C3 and the resistor R2 is sufficient to unblock the diode D205, the transistor circuit CT is actuated or fired to a conducting condition by the discharge of the timing capacitor C3 through a path which includes the resistor R212, the diode D205, the emitter-collector path of the transistor TR1, and the resistor R214, the negative conductor N1 and the resistor R2 to the lower end of the capacitor C3. The first transistor TR1 is thus turned "on" or actuated to a conducting condition and the current flow between the emitter and the collector of the first transistor TR1 along with the change in the voltage drop across the resistor R214 is sufficient to actuate the second transistor TR2 to a conducting condition by the current which flows from the base to the emitter of the second transistor TR1 and to the negative conductor N1 through the resistor R216. When the transistor TR2 begins conducting, current flows from the base of transistor TR1 into the collector of transistor TR2 which causes transistor TR1 to conduct more current and results in a regenerative turn on of the transistors TR1 and TR2. When the transistor TR2 is actuated to a conducting condition, an additional conducting path is established which extends from the collector of the transistor TR2 through the collector-emitter path of the transistor TR2 and the resistor R216 to the negative conductor N1. The corresponding change in the voltage drop across the resistor R216 which results is sufficient to produce a gating current for the thyristor 15 which flows from the emitter of the second transistor TR2 through the resistor R218, the gate-cathode path of the thyristor 15 and through the resistor R12 to the negative conductor N1 to thus actuate the thyristor 15 to a conducting condition. When the thyristor 15 is actuated to a conducting condition, current flows from the positive conductor P2 through the resistor R11, the anode-cathode path of thyristor 15 and the resistor R12 to the negative conductor N1. Current also flows from the cathode of the thyristor 15 into the gate-cathode path of thyristor 17 and to the negative conductor N1 to actuate the alternating current switching means which includes the thyristor 17 and the bridge circuit FW1 to a conducting or "on" condition.

It is to be noted that a complementary transistor circuit CT of the type described may be inadvertently fired or triggered by high frequency radiation from adjacent equipment. In order to prevent such inadvertent or spurious operations of the transistor circuit CT, the resistor R212 and the capacitor C212 are provided, as shown in FIGURE 5, to suppress such undesirable firing or triggering of the transistor circuit CT due to such high frequency interference which may result from arc interruptions in adjacent equipment. The balance of the operation of the time delay circuit 200 will be the same as previously described in connection with the time delay circuit 10.

It is to be understood that in certain applications other types of known alternating current switching means may be provided at the output of a particular time delay circuit embodying the teachings of the invention including combinations of oppositely poled thyristors, or combinations of thyristors and associated diodes in different known arrangements. In addition, a semiconductor device having bidirectional conducting characteristics such as a triac may be employer as the alternating current semiconductor switching means at the output of the particular time delay circuit as disclosed. It is also to be understood that a time delay circuit as disclosed may be employed in direct current applications and that in such applications the need for a rectifying arrangement of the input of the circuit is eliminated along with the need for a bidirectional switching means at the output which may be simplified to a unidirectional semiconductor switching means, such as a single controlled rectifier or thyristor.

The apparatus and circuits embodying the teachings of this invention has several advantages. For example, premature operations of the time delay circuit disclosed due to momentary interruptions in the input potential during the charging of the timing capacitor are eliminated by the alternate discharge path for the timing capacitor which substantially bypasses the associated semiconductor means which has a firing potential that is a predetermined fraction or ratio of the potential between two of the terminals of the associated semiconductor means. In addition, the discharge of the capacitor is controlled to be in periodic pulses or conducting periods by the use of the alternating current potential which is added or superimposed on the charging curve of the resistance-capacitance network disclosed without requiring a separate source of pulses other than the alternating current input potential which is otherwise required. In addition, the alternating current switching means at the output of each time delay circuit disclosed is maintained in a conducting condition as long as the alternating current input potential is applied at the input of the time delay circuit without requiring the use of a pulse transformer as is required in certain known time delay circuits. In addition, a time delay circuit of the disclosed invention permits relatively long time periods without requiring relatively large timing capacitors since the firing current for the semiconductor means, such as the unijunction transistor or the complementary transistor circuit disclosed, is largely supplied from the timing capacitor with the associated resistors in the resistance-capacitance network being thus less limited in values to provide longer time delay periods for a particular value of timing capacitor. Finally, by providing an isolating transformer at the input of the time delay circuit, the particular polarity or connections of the input terminals are immaterial insofar as protecting the semiconductor devices included in the time delay circuit from certain hazards due to voltage surges or other conditions which might injure the semiconductor devices.

Since numerous changes may be made in the above-described apparatus and circuits and different embodiments of the invention may be made without departing from the spirit and scope thereof, it is intended that all the matter contained in the foregoing description or shown in the accompanying drawings shall be interpreted as illustrative and not in a limiting sense.

What is claimed is:

1. A time delay circuit comprising a resistor and a capacitor connected in series across a source of electric potential whereby the capacitor is charged from the source through the resistor, semiconductor means including a pair of main terminals connected to said source of potential and a control terminal and having an operating characteristic such that when the potential applied between the control terminal and one of the main terminals is increased to substantially a predetermined portion of the potential applied between the main terminals, the effective impedance between the control terminal and said one of the main terminals is reduced to a relatively low value, means connecting the capacitor between the control terminal and said one of the main terminals to apply therebetween a potential which varies with the potential across the capacitor at least when the potential across the capacitor exceeds substantially a predetermined value, means for producing an output signal when the potential between the control terminal and said one of the main terminals increases to substantially a predetermined portion of the potential between said pair of main terminals to permit the capacitor to discharge along a path through the semiconductor means which includes the control terminal and said one of the main terminals a predetermined time after a potential is applied across the resistor and the capacitor from said source, and means for providing an alternate path to discharge at least a portion of the charge on the capacitor when the potential from said source of electric potential is momentarily interrupted during the charging of the capacitor and before the end of said predetermined time which bypasses the semiconductor means.

2. The combination as claimed in claim 1 wherein an additional means is provided for maintaining the potential between the main terminals of the semiconductor means above a value which would permit the capacitor to discharge through the semiconductive means while the capacitor is being discharged by the last-mentioned means.

3. The combination as claimed in claim 1 wherein the semiconductor means comprises a unijunction transistor having an emitter electrode and two base electrodes, the main terminals comprise the two base electrodes of the unijunction transistor and the control terminal comprises the emitter electrode of the unijunction transistor.

4. The combination as claimed in claim 2 wherein the semiconductor means comprises a unijunction transistor having an emitter electrode and two base electrodes, the main terminals comprise the two base electrodes of the unijunction transistor and the control terminal comprises the emitter electrode of the unijunction transistor.

5. The combination as claimed in claim 2 wherein the semiconductor means includes a pair of NPN and PNP transistors connected in a complementary circuit.

6. The combination as claimed in claim 2 wherein an additional means is connected in circuit relation with the capacitor for applying an alternating current potential to the semiconductor means between the control terminal and said one of the main terminals in addition to the potential which varies with the potential across the capacitor.

7. The combination as claimed in claim 6 wherein the anode and the cathode of the controlled rectifier are controlled rectifier having an anode, a cathode and a gate electrode connected in circuit relation with the semiconductor means to have the anode-cathode circuit of the controlled rectifier actuated to a conducting condition when the capacitor discharges along the path which includes the control terminal and said one of the main terminals of the semiconductor means.

8. The combination as claimed in claim 7 wherein the anode and the cathode of the controlled rectifier are connected in circuit relation with the source of potential to be maintained in a conducting condition after the controlled rectifier is actuated to a conducting condition by the discharge of the capacitor.

References Cited

UNITED STATES PATENTS

| | | | |
|---|---|---|---|
| 3,065,360 | 11/1962 | Vallese | 307—293 |
| 3,067,338 | 12/1962 | Baude | 307—202 |
| 3,315,246 | 4/1967 | Huffman et al. | 307—301 |
| 3,384,763 | 5/1968 | Harris | 307—305 |

JOHN S. HEYMAN, Primary Examiner

B. P. DAVIS, Assistant Examiner

U.S. CL. X.R.

307—202, 293, 305